US010233563B2

(12) United States Patent
Kim et al.

(10) Patent No.: US 10,233,563 B2
(45) Date of Patent: Mar. 19, 2019

(54) DEVICE FOR DETECTING ISLAND POSITION OF SINGLE CRYSTAL INGOT GROWING FURNACE AND METHOD FOR DETECTING ISLAND POSITION

(71) Applicant: Korea Institute of Industrial Technology, Cheonan-si, Chungcheongnam-do (KR)

(72) Inventors: Sung Ryul Kim, Seoul (KR); Churl Min Kim, Busan (KR); Hyung Ho Jo, Busan (KR); Youngchul Lee, Busan (KR); Hyoung Jae Kim, Busan (KR)

(73) Assignee: Korea Institute of Industrial Technology (KR)

( * ) Notice: Subject to any disclaimer, the term of this patent is extended or adjusted under 35 U.S.C. 154(b) by 397 days.

(21) Appl. No.: 14/872,309

(22) Filed: Oct. 1, 2015

(65) Prior Publication Data
US 2016/0032484 A1  Feb. 4, 2016

Related U.S. Application Data

(63) Continuation of application No. PCT/KR2013/010691, filed on Nov. 22, 2013.

(30) Foreign Application Priority Data

Oct. 2, 2013 (KR) .................. 10-2013-0117637

(51) Int. Cl.
C30B 15/20 (2006.01)
C30B 15/26 (2006.01)
(Continued)

(52) U.S. Cl.
CPC .............. *C30B 15/20* (2013.01); *C30B 15/26* (2013.01); *C30B 15/30* (2013.01); *C30B 29/20* (2013.01)

(58) Field of Classification Search
CPC combination set(s) only.
See application file for complete search history.

(56) References Cited

U.S. PATENT DOCUMENTS 5,886,737 A * 3/1999 Hiraishi .................. C30B 15/20
                                                      348/86
6,203,610 B1   3/2001 Altekruger et al.
(Continued)

FOREIGN PATENT DOCUMENTS

KR   2000-0068898 A   11/2000
KR   2003-0081328 A   10/2003
(Continued)

OTHER PUBLICATIONS

WIPO, International Search Report (PCT/KR2013/010691), dated Jul. 8, 2014.

*Primary Examiner* — Erin F Bergner
(74) *Attorney, Agent, or Firm* — Park & Associates IP Law, P.C.

(57) ABSTRACT

The present invention provides the device for detecting an island position of an ingot growing furnace, comprising a control means for detecting the position of an island by analyzing the image obtained by the photographing means, wherein the control means derives a plurality of singularities with respect to the temperature or brightness from the image, derives a plurality of connection lines respectively forming straight lines by the mutual connection of a series of the singularities, considers an area in which the most intersections are generated as an island among areas in which the plurality of connection lines intersect each other, and determines whether the island is positioned in a seed contact area in which the seed is set to be lowered.

10 Claims, 10 Drawing Sheets

(51) Int. Cl.
 *C30B 29/20* (2006.01)
 *C30B 15/30* (2006.01)

(56) References Cited

U.S. PATENT DOCUMENTS

| | | | |
|---|---|---|---|
| 6,454,851 | B1 | 9/2002 | Fuerhoff et al. |
| 7,573,587 | B1 * | 8/2009 | Lu .......................... C30B 15/20 356/634 |
| 2001/0043733 | A1 | 11/2001 | Altekruger et al. |

FOREIGN PATENT DOCUMENTS

| | | |
|---|---|---|
| KR | 10-2010-0067158 A | 6/2010 |
| KR | 10-2013-0044530 A | 5/2013 |

* cited by examiner

DEVICE FOR DETECTING ISLAND POSITION OF SINGLE CRYSTAL INGOT GROWING FURNACE AND METHOD FOR DETECTING ISLAND POSITION

REFERENCE TO RELATED APPLICATIONS

This is a continuation of pending International Patent Application PCT/KR2013/010691 filed on Nov. 22, 2013, which designates the United States and claims priority of Korean Patent Application No. 10-2013-0117637 filed on Oct. 2, 2013, the entire contents of which are incorporated herein by reference.

FIELD OF THE INVENTION

The present invention relates to a device for detecting an island position of a single crystal ingot growing furnace and a detecting method thereof.

More specifically, the present invention relates to a device for detecting an island position of a single crystal ingot growing furnace and a detecting method thereof, in which an image of the surface of a melt accommodated inside the growing furnace is acquired, and a position of an island of the melt is detected by processing the image, thereby generating an alarm signal or descending a seed when the position of the island enters into a target region.

BACKGROUND OF THE INVENTION

Since a single crystal sapphire is a material having advantages such as resistance to breakage, high strength and optical transmittance of wide wavelength range, it is used in a variety of fields such as logistics, aviation, optics, medical field and the like. Particularly, demands for sapphire ingots are exponentially growing recently for manufacture of light emitting diode (LED) products.

FIG. 1 is a view showing an example of a device for growing a single crystal in a conventional sapphire ingot growing furnace.

Describing the process of manufacturing an ingot, first, after raw materials are put into a crucible 2 of the growing furnace, a sapphire material is melted by operating a heating means.

Then, after a seed (seed crystal) 3 is mounted at the lower end of an ingot rod, the seed 3 is approached to the center of the surface of the melt inside the crucible 2 to contact with or partially dip into the melt by the operation of a seed operating means 4.

Growth of a sapphire single crystal begins by adjusting temperature of the crucible 2 in such a state, and then, a single crystal ingot of a shape close to a cylinder can be obtained by properly adjusting the pulling speed, position and temperature.

In the initial stage of the process, the seed 3 slowly ascends after contacting with the melt 1 by the operation of the seed operating means 4, and the point and time of the seed contacting with the melt 1 depend on visual observation and empirical judgment of a user.

FIG. 2 is a view schematically showing a flow state of the surface of a melt inside a growing furnace.

Referring to FIG. 2, an island is a portion indicated by reference numeral 6 in FIG. 2, and when melting of the melt is in a favorable normal state by heating, the island 6 appears as a distinguishable region having an area of a coin size. The flowing surface of the melt 1 is separated into an ascending portion 7 of high temperature, ascending from the bottom to the surface, and a descending portion 8 of slightly low temperature compared with the ascending portion 7, where the melt ascended to the surface descends again. A flow boundary line 9 appears around the descending portion 8 extended from the center in a radial shape as the melt in the neighborhood is gathered and descends, and such a flow boundary line 9 is created around the island 6 in a radial shape.

The island 6 is a portion where the melt descends, which is a region where the temperature is low compared with surrounding areas where the melt ascends. Accordingly, growth of a single crystal begins from the island 6 by contacting the seed 3 with the island 6 having a temperature lower than that of the surrounding areas.

The island 6 is not always generated at the center of the surface of the melt, and its position is changed according to the flow of the melt.

Accordingly, since a handler should handle descending of the seed 3 at a proper time point when the island 6 enters the descending position of the seed 3, there is a difficulty in that inside of the growing furnace of high temperature should be observed frequently with naked eyes to catch the time point.

Furthermore, since the seed 3 should accurately contact with the island 6, the position of which continuously changes, to produce a single crystal ingot of high quality, the work needs to be done by a highly skilled handler.

SUMMARY OF THE INVENTION

Therefore, the present invention has been made in view of the above problems, and it is an object of the present invention to provide a device for detecting an island position of an ingot growing furnace and a detecting method thereof, in which the position of an island in a melt flowing in a growing furnace can be automatically detected through the analysis of an obtained image to manufacture a single crystal such as a sapphire ingot.

Another object of the present invention is to provide a device for detecting an island position of an ingot growing furnace and a detecting method thereof, in which if the island arrives at a specific position using such a device for detecting an island position and a detecting method thereof, a descending time point of the seed is informed to a manager, or a control signal for automatically descending the seed can be outputted.

To accomplish the above objects, according to one aspect of the present invention, there is provided a device for detecting an island position of an ingot growing furnace, the device including: the ingot growing furnace in which an ingot material is melted; a photographing means installed on the top of the ingot growing furnace to acquire an image of the surface of a melt; a control means for detecting a position of an island by analyzing the image acquired by the photographing means; and a seed operating means provided on the top of the ingot growing furnace to descend a seed so that the seed may contact with the surface of the melt, and the control means derives a plurality of singular points related to temperature or brightness from the image, derives a plurality of connection lines respectively forming a straight line by connecting a series of singular points to each other, determines a region in which the largest number of intersections are generated as an island among regions in which the plurality of connection lines intersects with each other, and determines whether or not the island is positioned in a seed contact area set to descend the seed.

In addition, in order to detect the plurality of singular points, the control means consecutively acquires data related to temperature or brightness along a plurality of measurement lines parallel to each other on the image and derives positions of the singular points by differentiating the data for each of the plurality of measurement lines.

In addition, the photographing means includes a shutter for blocking the photographing means from the surface of the melt and a shutter operating means for operating the shutter, and the shutter operating means prevents increase of temperature of the photographing means by opening the shutter only for a predetermine time when an operation signal for acquiring the image is input.

In addition, the device for detecting an island position further includes a display means, and the control means controls the display means to generate an alarm signal on the display means when the island is positioned in the seed contact area.

In addition, the control means controls the seed operating means to descend the seed to the surface of the melt when the island is positioned in the seed contact area.

In addition, the device for detecting an island position further includes a display means, and the control means identifies a size of the island, and when the island is positioned in the seed contact area and the size of the island is larger than a set size, the control means controls the display means to generate an alarm signal on the display means.

In addition, the control means identifies a size of the island, and when the island is positioned in the seed contact area and the size of the island is larger than a set size, the control means controls the seed operating means to descend the seed to the surface of the melt.

According to another aspect of the present invention, there is provided a method for detecting an island position of an ingot growing furnace for detecting a position of an island using a device for detecting an island position of an ingot growing furnace including the ingot growing furnace in which an ingot material is melted; a photographing means installed on the top of the ingot growing furnace to acquire an image of the surface of a melt; a control means for detecting the position of the island by analyzing the image acquired by the photographing means; and a seed operating means provided on the top of the ingot growing furnace to descend a seed so that the seed may contact with the surface of the melt, and the method for detecting an island position includes a first step of acquiring an image of a surface of a melt by the photographing means; a second step of deriving a plurality of singular points related to temperature or brightness from the image acquired at the image acquisition step; a third step of deriving a plurality of connection lines respectively forming a straight line by connecting a series of singular points to each other; a fourth step of deriving the island which is a region in which the largest number of the connection lines intersect with each other; and a fifth step of determining whether or not the island is positioned in a seed contact area set to descend the seed.

In addition, in order to detect the plurality of singular points, the second step consecutively acquires data related to temperature or brightness along a plurality of measurement lines parallel to each other on the image and derives positions of the singular points by differentiating the data for each of the plurality of measurement lines.

In addition, the method for detecting an island position further includes, after the fifth step, a sixth step of generating an alarm signal on a display means when the island is positioned in the seed contact area.

In addition, the method for detecting an island position further includes, after the fifth step, a sixth step of descending the seed to the surface of the melt by the seed operating means when the island is positioned in the seed contact area.

In addition, the method for detecting an island position further includes a separate step of identifying a size of the island, and further includes, after the fifth step, a sixth step of generating an alarm signal on a display means when the island is positioned in the seed contact area and the size of the island is larger than a set size.

In addition, the method for detecting an island position further includes a separate step of identifying a size of the island, and further includes, after the fifth step, a sixth step of descending the seed to the surface of the melt by the seed operating means when the island is positioned in the seed contact area and the size of the island is larger than a set size.

In addition, the size of the island is identified by selecting pixels having temperature or brightness lower than a predetermined level from the image, forming a plurality of pixel groups formed as a cluster by gathering pixels adjacent to each other within a set distance among the selected pixels, and determining an area of a pixel group positioned at the island among the plurality of formed pixel groups as the size of the island.

According to the device for detecting an island position of a single crystal ingot growing furnace and a detecting method thereof, the position of an island of a melt accommodated inside the growing furnace can be accurately detected without visual observation of a worker.

Since it can be implemented to inform a descending time point of the seed or automatically generate a descending operation of the seed through a result of the detection, a single crystal ingot of high quality can be produced even by an unskilled worker, and working time and effort of the worker involved in production of the single crystal ingot can be reduced.

The device for detecting an island position of the present invention and the detecting method thereof are not limited only to a sapphire ingot, but can be utilized in a single crystal growing furnace of various materials including a process of contacting the seed to the island.

DETAILED DESCRIPTION OF THE INVENTION

An embodiment of the present invention will be described in further detail with reference to the accompanying drawings.

Figure 3:
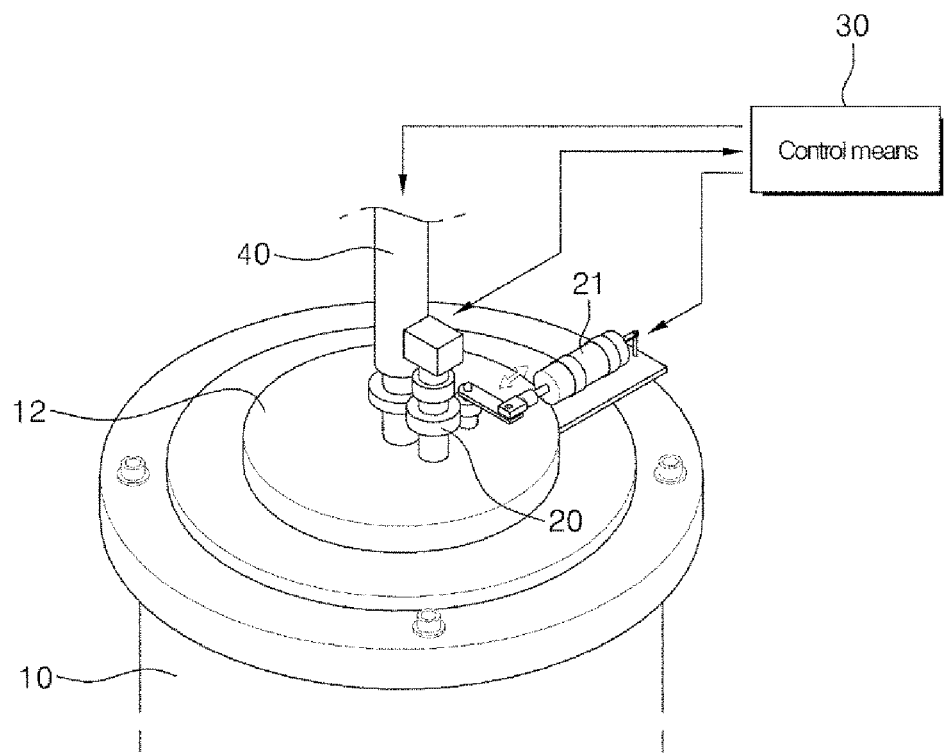
FIG. 3 is a view showing the configuration of a device for detecting an island position of an ingot growing furnace according to an embodiment of the present invention.

Referring to FIG. 3, a device for detecting an island position of an ingot growing furnace 10 according to an embodiment of the present invention includes: the ingot growing furnace 10 in which an ingot material is melted; a photographing means 20 installed on the top of the ingot growing furnace 10 to acquire an image of the surface of a melt; a control means 30 for detecting a position of an island 6 by analyzing the image acquired by the photographing means 20; and a seed operating means 40 provided on the top of the ingot growing furnace 10 to descend a seed 3 so that the seed may contact with the surface of the melt.

A crucible 2 for filling and melting a material for forming a single crystal such as sapphire or the like is installed inside the ingot growing furnace 10.

A heating means is installed outside the crucible 2 to melt the material supplied in the crucible 2, and a cooling means is installed outside the heating means to stabilize the device for detecting an island position by diffusing heat distribution of the heating means and the crucible.

A top cover 12 is installed on the top of the ingot growing furnace 10 to perform a function for protecting the melt melted in the crucible 2, and a photographing means 20, a seed operating means 40 and the like are fixed onto the top cover 12.

The seed operating means 40 is vertically installed at the center portion of the top cover 12 of the ingot growing furnace 10, in which a seeding rod attaching the seed 3 at the lower end is provided, and the seed 3 may contact with the surface of the melt or dip into the melt by descent of the seeding rod.

The photographing means 20 is installed at one side of the seed operating means 40 on the top cover 12 of the ingot growing furnace 10 and photographs the surface of the melt from the bottom of the top cover 12. A general high quality imaging camera capable of obtaining an image of a surface of high temperature or a thermal imaging camera for measuring distribution of temperature on the surface of a melt can be used.

The photographing means 20 is an element for photographing a flow boundary line 9 on the surface of the melt, and since a difference in brightness is observed with naked eyes at a portion where a boundary is formed when the melt flows and a difference occurs even in the distribution of temperature between the flow boundary line 9 and the surrounding areas, photographing is performed using this feature.

Figure 1:
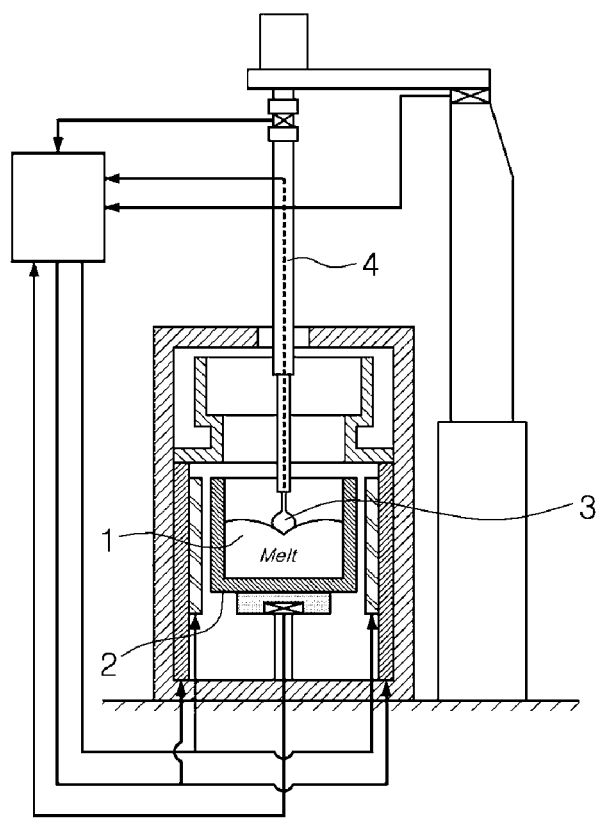
FIG. 1 is a view showing the configuration of an example of a device for growing a single crystal in a conventional sapphire ingot growing furnace.
Figure 2:
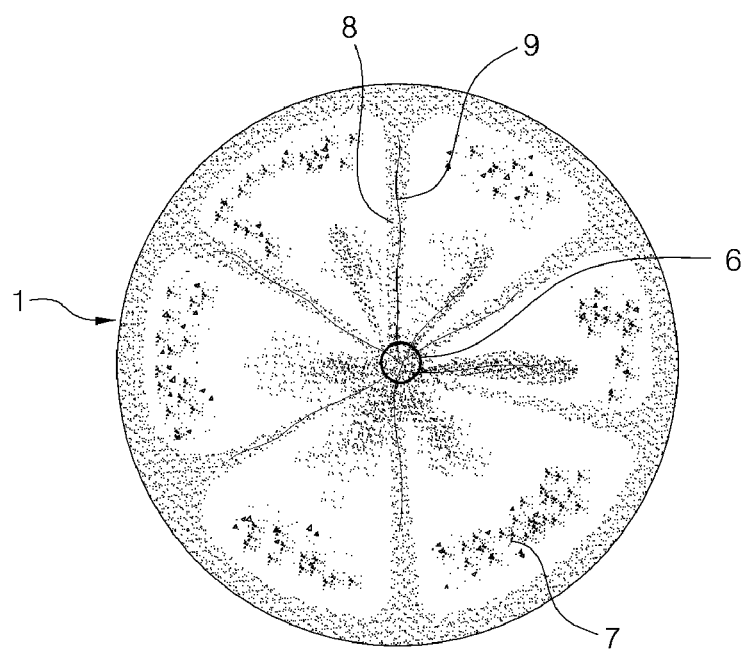
FIG. 2 is a view schematically showing a flow state of the surface of a melt inside a growing furnace.
Figure 6A:
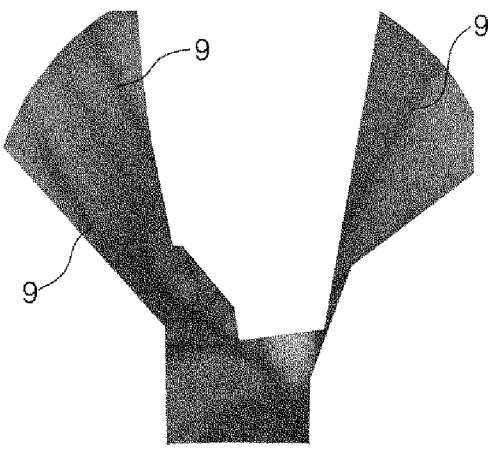
FIG. 6(a) is a view showing an actual image of the surface of a melt photographed by a photographing means.

The image of the surface of the melt photographed by the photographing means 20 described above generates a difference in brightness or color at the flow boundary line 9 shown in FIG. 2. Referring to FIG. 6(a), it can be confirmed that there is a difference in brightness between the flow boundary line 9 and surrounding areas in an actual image.

It is preferable to block the light emitted from the surface of the melt of high temperature to limit the amount of light at a predetermined rate by installing a neutral density (ND) filter in the photographing means 20.

In addition, the photographing means 20 includes a shutter for blocking the photographing means 20 from the surface of the melt and a shutter operating means 21 for operating the shutter.

The shutter operating means 21 is connected to digital I/O of a control system to control a pneumatic cylinder, which drives the shutter by opening and closing a solenoid valve.

Opening and closing the shutter is performed for a predetermined time (a few seconds) by the operation of the pneumatic cylinder. The shutter blocks the photographing means 20 from the melt of high temperature under the top cover 12 of the ingot growing furnace 10, and the shutter is open for a predetermined time only when an image is photographed.

Since the shutter is open when an operation signal for acquiring an image is input from the control means 30 and the shutter is closed other than the time when the photographing means 20 takes photographs, factors of defective photography according to increase and change of temperature of the photographing means 20 caused by radiant heat are minimized.

Meanwhile, the control means 30 transmits a control signal for controlling temperature of the ingot growing furnace 10, operating the shutter operating means 21 or operating the seed operating means 40. In addition, the control means 30 first detects a position of the island 6 by analyzing the image acquired by the photographing means 20 to perform a descending operation of the seed 3 by the seed operating means 40.

If a position of the island 6 is detected by the control means 30 and the island 6 moved by the flow of the melt on the surface of the melt enters a set region, the control means 30 contacts the seed 3 with the melt (island) by operating the seed operating means 40 downwards.

Hereinafter, the operation process of the control means 30 for detecting a position of the island 6 by analyzing the image acquired by the photographing means 20 will be described.

Figure 4:
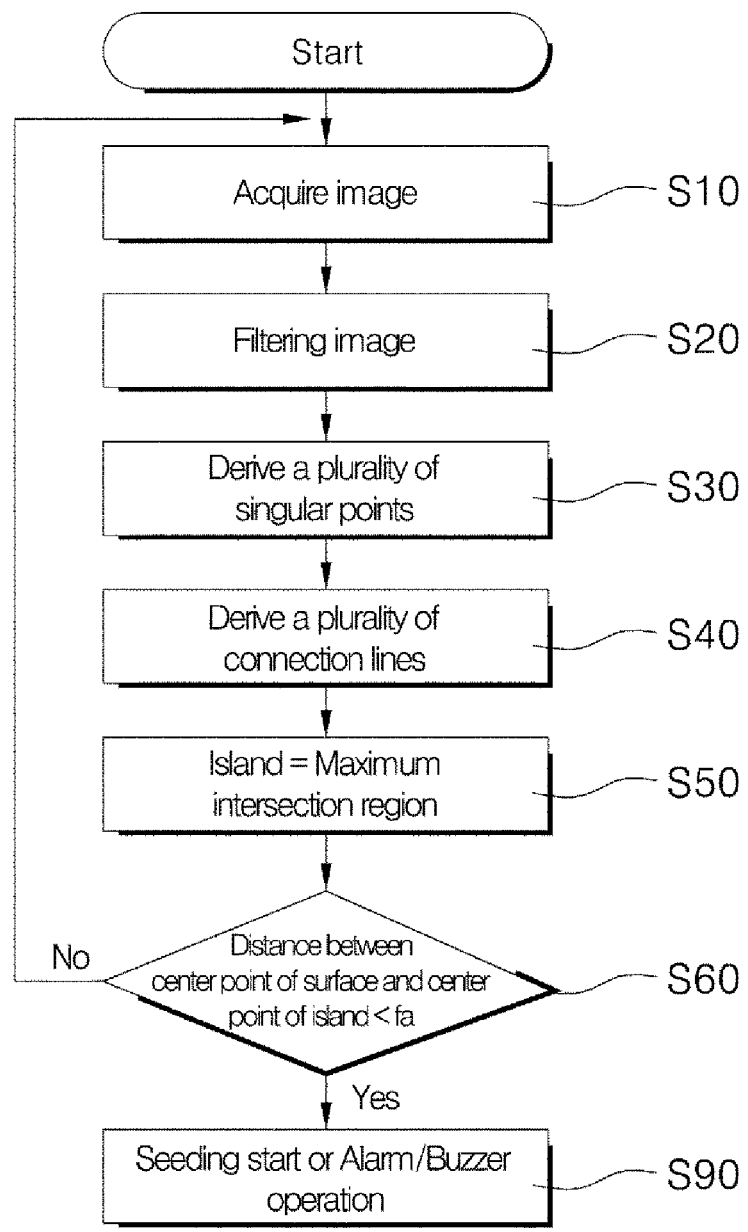
FIG. 4 is a flowchart illustrating an operation process of a control device in a device for detecting an island position of an ingot growing furnace according to an embodiment of the present invention.

Referring to FIG. 4, first, the control means 30 acquires an image of the surface of the melt by transmitting an operation signal to the photographing means 20 (step S10).

If the control signal of the control means 30 is transmitted, the shutter is open for a few seconds, and photographing an image is performed by a synchronized camera. Then, the shutter is closed to protect the camera from the radiant heat of high temperature.

Since the operation of the photographing means 20 for opening and closing the shutter to acquire an image and taking photographs between the opening and closing of the shutter as described above is repeated at predetermined time intervals (e.g., every ten seconds), the position of the island 6 which is changing on the surface of the melt due to the flow of the melt can be monitored at every set time intervals.

The photographed image of the surface of the melt is briefly shown in FIG. 2, and the shape of the flow boundary line 9 or the like changes with time since flow of the melt continuously occurs.

Meanwhile, if the image acquired by the photographing means 20 is transmitted to the control unit 30, a filtering process is performed on the image to remove non-regions of interest and noises (step S20).

The non-regions of interest are removed using a publicized masking method in order to acquire images of only the regions of interest. Excessive generation of noises or singular points described below is prevented by removing the non-regions of interest.

Information (colors) unnecessary for analysis of the image is deleted from the image from which the non-regions of interest are removed, and the image is converted into a gray scale for convenience of data processing.

If the conversion is completed, multiplication is performed by multiplying the value of each pixel by a predetermined value in order to display flow of the surface of the melt further clearly.

If the image filtering process is completed, a process of deriving a plurality of singular points from the image is performed (step S30).

The process of deriving a plurality of singular points is performed to acquire position data of the flow boundary lines 9 from the surface of the melt. If the position data of the flow boundary lines 9 are acquired from the image, a position of the island 6 where the flow boundary lines 9 are gathered can be grasped.

Figure 5:
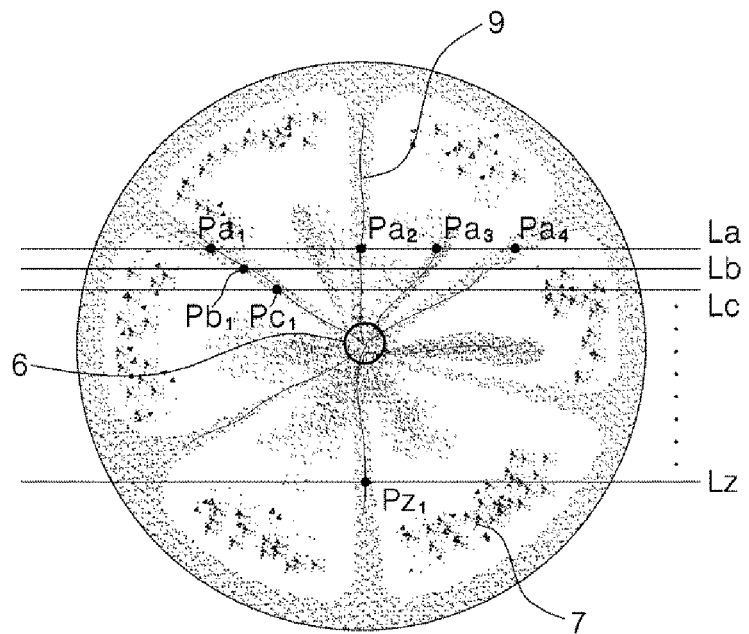
FIG. 5 is a view showing a process of deriving singular points from an image in a device for detecting an island position of an ingot growing furnace according to an embodiment of the present invention.

Referring to FIG. 5, data related to temperature or brightness is consecutively acquired along a plurality of measurement lines La, Lb, Lc . . . and Lz parallel to each other on the image, and positions of the singular points Pa1, Pa2, Pa3, Pa4, Pb1, Pc1 and Pz1 are derived by differentiating the data for each of the plurality of measurement lines.

That is, in order to derive the singular points Pa1, Pa2, Pa3, Pa4, Pb1, Pc1 and Pz1, data related to temperature or brightness are consecutively acquired along the measurement lines formed in the shape of straight lines extended horizontally on the image. The data related to temperature or brightness is acquired for each pixel along the measurement lines.

The flow boundary line 9 shown on the surface of the melt is a region in which melts moving on the surface of the melt descend while colliding with each other, and it is expressed in the form of a line. In addition, since the flow boundary line 9 is a portion of comparatively low temperature and is different from the surrounding areas in brightness, brightness of the surrounding areas can be distinguished from the brightness of the flow boundary line 9.

If an image is photographed by a thermal imaging camera to express distribution of temperature in different colors, it is possible to acquire color data and derive singular points for each measurement line from the color data according to difference in chromaticity. Since the color data express distribution of temperature, they can be regarded as data related to temperature.

If the singular points are derived from the color data by the chromaticity, the process of converting the image to the gray scale described above should be omitted.

Since the singular points Pa1, Pa2, Pa3, Pa4, P131, Pc1 and Pz1 are points where the measurement lines actually meet the flow boundary lines 9, further accurate flow boundary lines 9 can be searched if the measurement lines La, Lb, Lc . . . and Lz parallel to each other are densely arranged. However, since the amount of data to be processed increases, the number of generated singular points should be adjusted according to the processing capacity of the control means 30 by properly increasing and decreasing the distance between the measurement lines La, Lb, Lc . . . and Lz.

Since the flow boundary line 9 on which the singular points are positioned is a boundary area in which brightness gradually decreases to be minimum brightness at the flow boundary line 9 and increases again when the brightness is measured along the measurement lines La, Lb, Lc . . . and Lz, the position of the flow boundary line 9 can be confirmed by the singular points generated when the data acquired for each of the measurement lines La, Lb, Lc . . . and Lz are consecutively differentiated.

Figure 6B:
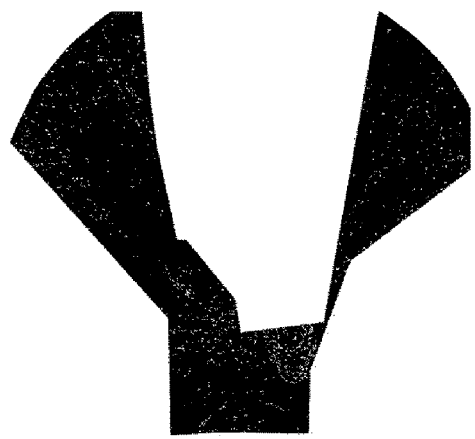
FIG. 6(b) is a view showing an image processed to derive singular points from the image and express the singular points as a plurality of points.

FIG. 6(a) is a view showing an actual image photographed by the photographing means 20, and FIG. 6(b) is a view showing an image in which singular points are derived from the image and expressed as a plurality of points. For reference, FIG. 6(a) is a view extracted to show only the portions exposing the surface of the melt after removing the portions hidden by obstacles in the melting furnace 10.

If the image from which the singular points are derived is binarized, it makes the image clear, and the process of deriving connection lines can be performed more easily thereafter.

Meanwhile, after the singular points are derived, a process of deriving a plurality of connection lines 50 for connecting a plurality of singular points is performed (step S40).

This is a process of deriving a plurality of straight lines which are determined to be the flow boundary lines 9 when the singular points are connected to each other on the image from which the singular points are derived.

Hough transform is used to derive the connection lines 50.

Figure 7:
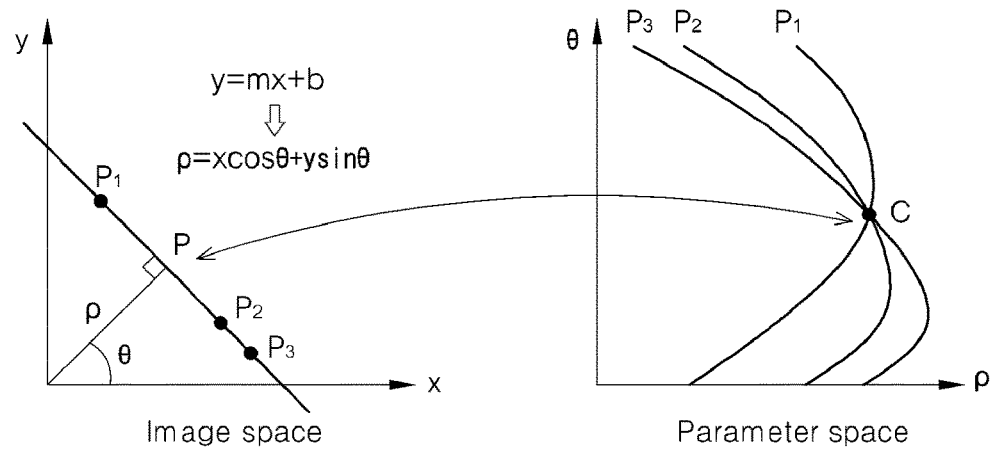
FIG. 7 is a view showing the principle of Hough transform.

Referring to FIG. 7, equation y=mx+b expressing a straight line on an image configured of x and y axes can be converted into equation $\rho = x \cos \theta + y \sin \theta$. Here, $\rho$ denotes length of a normal line between the origin point and the straight line, and $\theta$ denotes an angle of the normal line with respect to the x axis.

As is known to everybody, the Hough transform expresses equation $\rho = x \cos \theta + y \sin \theta$ expressing a straight line in an image space as curved lines in a parameter space of $\theta$ and $\rho$ axes. In addition, the points P1, P2 and P3 positioned on the straight line $\rho = x \cos \theta - y \sin \theta$ in the image space are respectively expressed as curved lines P1, P2 and P3 in the parameter space having $\theta$ and $\rho$ axes.

As a result, since it has a property of expressing a point in the parameter space as a line in the image space and the points P1, P2 and P3 in the image space are points on one straight line, a point C on which the curved lines P1, P2 and P3 intersect with each other is created in the parameter space. The point C represents a straight line $\rho = x \cos \theta - y \sin \theta$ in the image space.

Figure 8A:
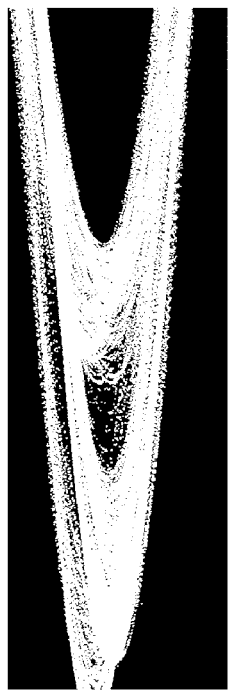
FIG. 8(a) is a graph showing singular points expressed on an image as a plurality of curved lines on a parameter space using Hough transform.

In this embodiment, the singular points on the image shown in FIG. 6(b) are respectively expressed as a straight line in the parameter space as shown in FIG. 8(a) by utilizing the Hough transform. Since a corresponding curved line is created for each of the plurality of singular points, a large number of curved lines are expressed while being overlapped with each other.

Like the principle of the Hough transform of FIG. 7, the curved lines respectively created in the parameter space by the points existing on one straight line on an image have a property of intersecting at one point C, which means the straight line. Accordingly, if the plurality of curved lines created in FIG. 8(a) intersects at one points, it is understood that the plurality of curved lines having the one intersection point is created by the points existing on one straight line on the image.

Figure 8B:
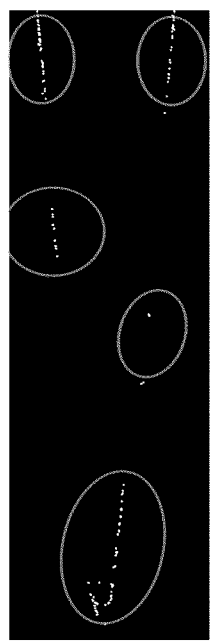
FIG. 8(b) is a view showing a state of remaining only intersection points where the curved lines of FIG. 8(a) meet on the parameter space.

Accordingly, if intersection points where a plurality of curved lines intersects at one point are derived from FIG. 8(a) and only intersection points having a predetermined number (e.g., five or more) of curved lines intersecting at one intersection point are remained, a plurality of intersection points (the portions expressed as a circle) remains in the parameter space as shown in FIG. 8(b).

Figure 9:
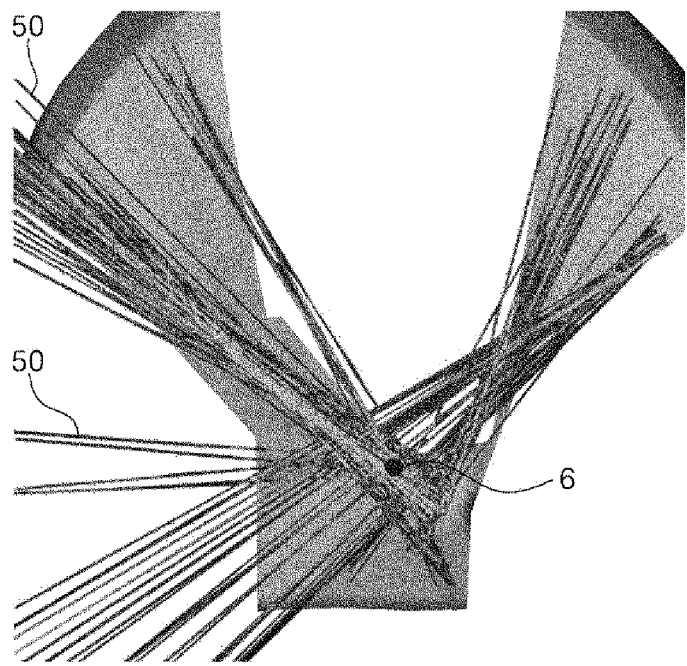
FIG. 9 is a view expressing the intersection points of FIG. 8(b) as straight lines on a photographed image.

If the straight line is created again by converting the intersection points shown in the parameter space of FIG. 8(b) onto the image, the intersection points remaining in the parameter space are converted into a plurality of one-to-one matching straight lines on the image as shown in FIG. 9. The straight lines become connection lines 50, which are considered as connection of the singular points positioned on the flow boundary line 9 among the plurality of singular points.

After deriving a plurality of connection lines 50, a region in which the largest number of the connection lines 50 intersect is derived as an island 6 (step S50).

If a plurality of intersection points of the connection lines 50 is generated and distributed, the control means 30 searches for a region in which the largest number of intersection points are generated on the image and derives a position of the island 6. At this point, the region in which the largest number of intersection points are generated is a region in which the largest number of intersection points are generated within a set search area, and the center point of the region is determined as the center point of island 6.

Figure 10:
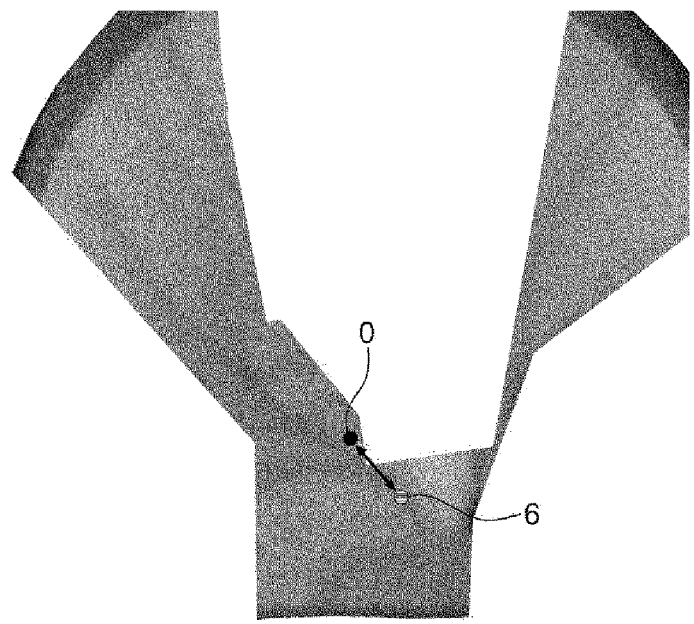
FIG. 10 is a view showing the center point of the surface of a melt and a position of an island.

Then, as shown in FIG. 10, the distance between the coordinates of the center point of the acquired island 6 and the center point o of the surface of the melt is measured (step S60). The center point o of the surface of the melt is the center point of a seed contact area set to descend the seed 3. An actual distance can be measured through pixel information, and it is determined whether or not the distance is less than a set distance fa (step S60).

Determining whether or not the distance is less than a set distance fa is determining whether or not the position of the island 6, which continuously changes, is positioned in the seed contact area, and if the distance is less than the set distance fa, it means that the island 6 is positioned in the seed contact area since the island 6 enters the seed contact area set to descend the seed 3.

Then, if the distance is less than the set distance fa, alarm information is provided so that a worker may recognize, or it is operated to contact the seed 3 with the island 6 by transmitting a control signal for auto-seeding (step S90).

If the distance is greater than the set distance fa, the process of acquiring the image again and deriving a position of the island as described above (steps S10 to S60) is repeated.

Next, another embodiment of the present invention will be described.

In this embodiment, it is confirmed whether or not the island 6 enters the seed contact area and is positioned in the seed contact area, and, at the same time, a size of the island 6 is determined, and only when the size of the island 6 is larger than a set size, alarm information is provided, or auto-seeding is performed.

In relation to growth of a sapphire single crystal ingot, since a seeding work needs to be performed if the size of the island 6 is larger than a set size, the process of this embodiment is applied.

Figure 11:
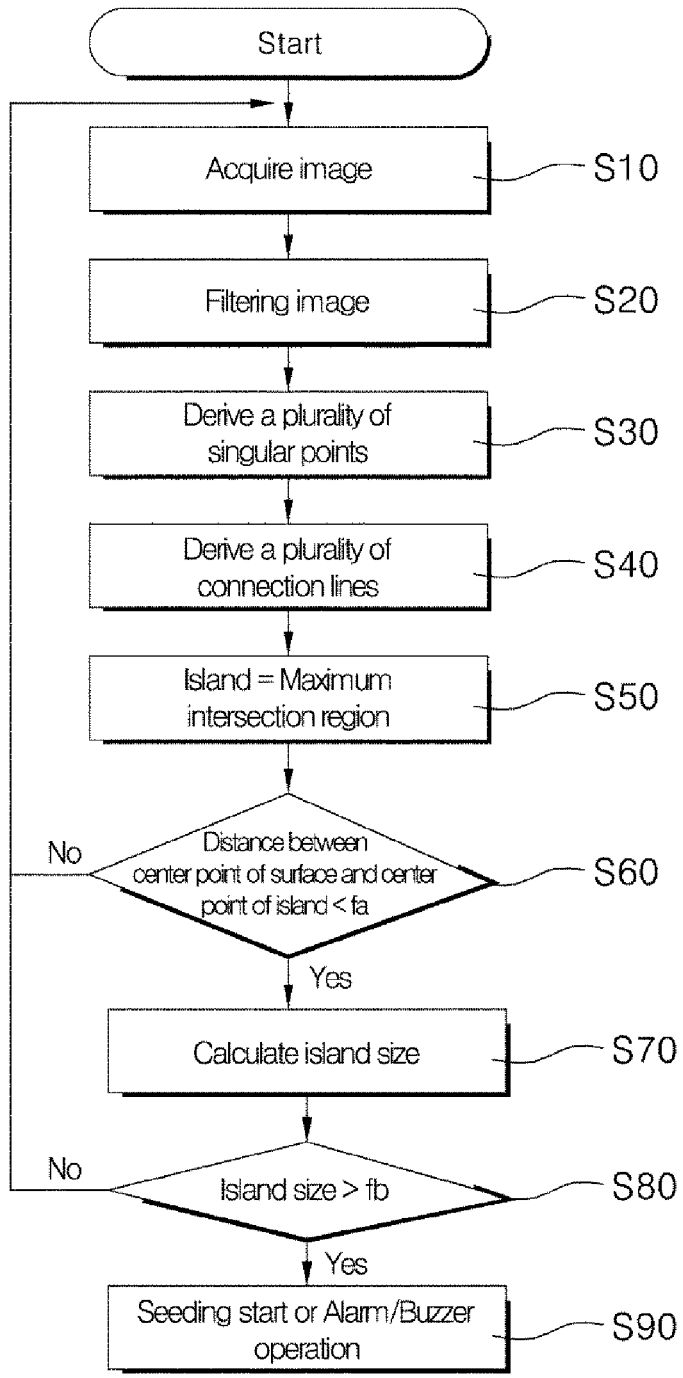
FIG. 11 is a flowchart illustrating an operation process of a control device in a device for detecting an island position of an ingot growing furnace according to another embodiment of the present invention.

FIG. 11 is a flowchart illustrating an operation process of a control means 30 according to another embodiment of the present invention.

Referring to FIG. 11, the process of detecting a position of the island 6, calculating a distance from the center point of the surface of the melt and determining whether or not the distance is within a set distance fa (steps S10 to S60) is the same as that of the embodiment described above.

However, in this embodiment, the process of determining a size of the island 6 is progressed after the process of detecting a position of the island 6 (steps S10 to S60) or in parallel with the calculation process (steps S10 to S60).

Accordingly, in this embodiment, alarm information is provided or a control signal for auto-seeding is generated on condition that the island 6 is positioned within the set distance fa from the center point o of the surface of the melt and, at the same time, the size of the island 6 is larger than a set size fb.

The process of detecting a position of the island 6 and calculating a distance from the center point o of the surface of the melt (steps S10 to S60) is the same as described in the embodiment described above, and the process of determining a size of the island 6 is described hereinafter. For reference, the island 6 appears as a region having an area of a coin size when a time appropriate for seeding arrives.

Figure 12A:
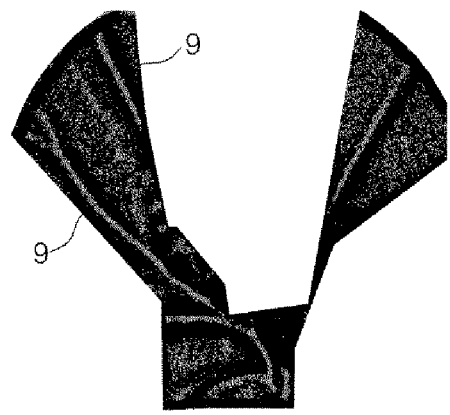
FIG. 12(a) is a view showing binarization of a photographed image in a device for detecting an island position of an ingot growing furnace according to another embodiment of the present invention.

First, the image is binarized as shown in FIG. 12(a) to calculate a size of the island 6. That is, the image of FIG. 6(a) acquired by the photographing means 20 is converted as shown in FIG. 12(a) by binarizing the image in a method of expressing a pixel in a bright color only when brightness of the pixel is lower than a predetermined level and expressing a pixel having brightness beyond the level in black color.

Figure 12B:
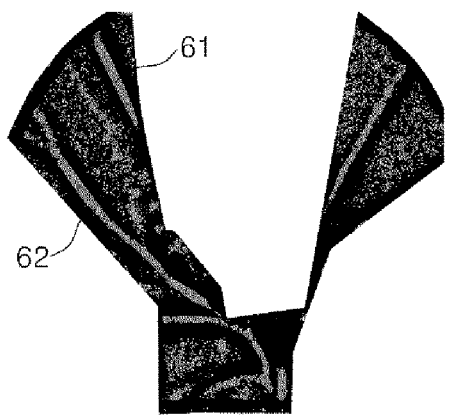
FIG. 12(b) is a view showing groups of adjacent pixels having a bright color in a binarized image.

Pixel groups 61 and 62 of a cluster shape are created as shown in FIG. 12(b) by grouping adjacent pixels of a bright color from the image binarized as shown in FIG. 12(a).

A publicized convex hull algorithm is used in the grouping process.

The convex hull algorithm is an algorithm for drawing a contour line of points with ease, and starting from an arbitrary point 'a' on the outskirts, a method of forming a connection line between the arbitrary point and a point positioned in a direction of the largest angle with respect to the arbitrary point 'a' among the points in the neighborhood at a distance less than a set distance Rc and forming a connection line between the point connected by the connection line and a point positioned in a direction of the largest angle with respect to the point connected by the connection line among the points in the neighborhood at a distance less than the set distance Rc is repeated, and thus the connection lines become a contour line, and start and stop of the contour line is accomplished at the arbitrary point 'a'. In this embodiment, the set distance Rc is preferably set to be 1 mm or less, and an input value thereof may vary according to empirical judgment.

If adjacent pixels of a bright color are grouped in the binarized image of FIG. 12(a) using the convex hull algorithm, a plurality of pixel groups 61 and 62 can be created in the form of separated clusters as shown in FIG. 12(b).

Figure 13A:
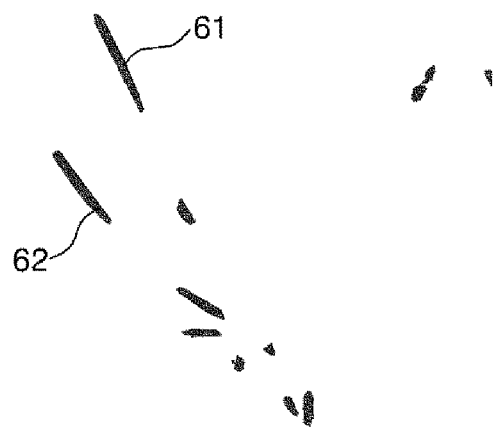
FIG. 13(a) is a view showing an image extracting the pixel groups of FIG. 12(b)
Figure 13B:
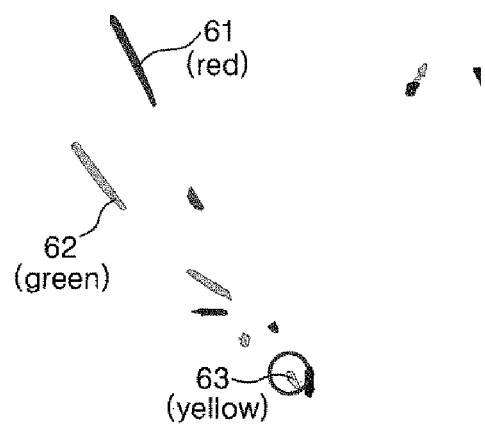
FIG. 13(b) is a view showing a process of labeling pixel groups and detecting an island.

If pixel groups having an area less than a predetermined level are deleted from the image passing through the grouping process and remaining pixel groups are extracted, pixel groups 61 and 62 as shown in FIG. 13(a) remain. After labeling and expressing the remaining groups 61 and 62 in different colors, center coordinates, a size and the like are calculated for each label.

Then, a pixel group 63 of center coordinates at a distance nearest from the coordinates of the detected island 6 is defined an island 6, and the size of the pixel group is compared with the set size fb (step S80).

If the condition that the size of the pixel group 63 corresponding to the island 6 is larger than the set size fb is satisfied as a result of the comparison, the control means 30 provides alarm information or auto-seeding is performed under the condition that the island 6 is positioned within the set distance fa from the center point o of the surface of the melt in the process performed before (step S90).

If the size of the island 6 is smaller than the set size fb, the process of acquiring an image again, deriving a position of the island 6 and comparing the size of the island 6 described above (steps S10 to S80) is repeated.

The device for detecting an island position of a single crystal ingot growing furnace and a detecting method thereof according to the present invention can be advantageously used as a device and method for automation of a growing furnace for manufacturing a single crystal ingot. Particularly, it can be advantageously utilized in the process of manufacturing a sapphire single crystal ingot.

What is claimed is:

1. A method for detecting a position of an island using a device for detecting an island position in an ingot growing furnace for melting an ingot material therein, the method comprising the steps of:
   a first step of acquiring an image of a surface of the melting ingot material in the ingot growing furnace by a photographing camera installed at the ingot growing furnace, where the surface in the image comprises the island and descending portions extended radially from a peripheral area of the surface to the island and having different temperatures than the melting ingot material, the descending portions being identified as flow boundary lines;
   a second step of deriving a plurality of singular points related to temperature or brightness from the image acquired by the photographing camera, and the plurality of singular points are identified along a plurality of measurement lines parallel to each other on the image, and positions of the singular points are derived by differentiating data for each of the plurality of measurement lines, the singular points being located on the flow boundary lines;
   a third step of deriving a plurality of connection lines respectively formed by connecting a plurality of the derived singular points to each other;
   a fourth step of deriving the island which is a region in which a largest number of the plurality of connection lines intersect with each other; and
   a fifth step of determining whether or not the island is positioned in a seed contact area set to descend the seed, using a predefined criterion.

2. The method according to claim 1, further comprising, after the fifth step, a sixth step of generating an alarm signal on a display when the island is positioned in the seed contact area.

3. The method according to claim 1, further comprising, after the fifth step, a sixth step of descending the seed to the surface of the melting ingot material by a seed operating means when the island is positioned in the seed contact area.

4. The method according to claim 1, further comprising a separate step of identifying a size of the island, and further comprising, after the fifth step, a sixth step of generating an alarm signal on a display when it is determined that the island is positioned in the seed contact area and the size of the island is larger than a set size.

5. The method according to claim 1, further comprising a separate step of identifying a size of the island, and further comprising, after the fifth step, a sixth step of descending the seed to the surface of the melting ingot material by a seed operating means when it is determined that the island is positioned in the seed contact area and the size of the island is larger than a set size.

6. The method according to claim 4, wherein the size of the island is identified by selecting pixels having temperature or brightness lower than a predetermined level from the image, forming a plurality of pixel groups formed as a cluster by gathering pixels adjacent to each other within a set distance among the selected pixels, and determining an area of a pixel group positioned at the island among the plurality of formed pixel groups as the size of the island.

7. The method according to claim 5, wherein the size of the island is identified by selecting pixels having temperature or brightness lower than a predetermined level from the image, forming a plurality of pixel groups formed as a cluster by gathering pixels adjacent to each other within a set distance among the selected pixels, and determining an area of a pixel group positioned at the island among the plurality of formed pixel groups as the size of the island.

8. The method according to claim 1, wherein the image is indicative of a surface distribution of thermal/radiative energy exclusively emanating from the surface of the melting ingot material in the ingot growing furnace.

9. The method according to claim 1, wherein the image is acquired by intermittently opening a shutter only during acquiring the image.

10. The method according to claim 1, wherein the photographing camera is a synchronized camera.

* * * * *